(12) United States Patent
Knight

(10) Patent No.: US 7,265,976 B1
(45) Date of Patent: Sep. 4, 2007

(54) MICROCHANNEL THERMAL MANAGEMENT SYSTEM

(75) Inventor: Paul A. Knight, Spokane, WA (US)

(73) Assignee: Isothermal Systems Research, Inc., Liberty Lake, WA (US)

( * ) Notice: Subject to any disclaimer, the term of this patent is extended or adjusted under 35 U.S.C. 154(b) by 352 days.

(21) Appl. No.: 10/827,993

(22) Filed: Apr. 19, 2004

(51) Int. Cl.
*H05K 7/20* (2006.01)

(52) U.S. Cl. ............... 361/699; 361/714; 361/718; 361/719; 257/714

(58) Field of Classification Search ............ 361/719
See application file for complete search history.

(56) References Cited

U.S. PATENT DOCUMENTS

| | | | |
|---|---|---|---|
| 4,450,472 A | 5/1984 | Tuckerman et al. | 357/82 |
| 4,567,505 A | 1/1986 | Pease et al. | 357/81 |
| 6,528,878 B1 * | 3/2003 | Daikoku et al. | 257/714 |
| 6,650,542 B1 | 11/2003 | Chrysler et al. | 361/699 |
| 2003/0062149 A1 | 4/2003 | Goodson et al. | 165/104.11 |
| 2003/0085024 A1 * | 5/2003 | Santiago et al. | 165/104.11 |
| 2003/0164231 A1 | 9/2003 | Goodson et al. | 165/104.11 |
| 2004/0008487 A1 * | 1/2004 | Hisano et al. | 361/690 |

* cited by examiner

*Primary Examiner*—Michael Datskovskiy
(74) *Attorney, Agent, or Firm*—Michael S. Neustel

(57) ABSTRACT

A microchannel thermal management system for thermally managing a heat producing device. The microchannel thermal management system includes a housing having an interior surface, a cap having a plurality of microchannels attached to the interior surface of the housing, and an inlet port and an outlet port extending through the housing in fluid communication with the microchannels. Alternatively, the microchannels may also extend into the interior surface of the housing. The cap is preferably thermally attached to a heat producing device by a thermal interface layer. Thermally managed coolant enters the inlet port passing through the microchannels conducting heat transferred to the cap by the heat producing device and exits through the outlet port.

10 Claims, 9 Drawing Sheets

MICROCHANNEL THERMAL MANAGEMENT SYSTEM

CROSS REFERENCE TO RELATED APPLICATIONS

Not applicable.

STATEMENT REGARDING FEDERALLY SPONSORED RESEARCH OR DEVELOPMENT

Not applicable to this application.

BACKGROUND OF THE INVENTION

1. Field of the Invention

The present invention relates generally to thermal management systems for electronic devices and more specifically it relates to a microchannel thermal management system for thermally managing a heat producing device.

2. Description of the Related Art

Thermal management systems for heat producing devices (e.g. chips, integrated circuits, optoelectronic devices, power electronics and other electronic devices). Examples of commonly utilized thermal management systems are comprised of heat sinks, air-cooling, cold plates, liquid immersion and spray cooling.

A heat producing devices (e.g. chips) typically has at least one "hot zone" that has higher heat production (e.g. floating point on a chip) than other zones (e.g. cache on a chip). It is therefore desirable to providing increased thermal management within the hot zones of the heat producing device thereby increasing the thermal management efficiency of the device.

A commonly utilized form of thermal management comprises the usage of etched microchannels that receive coolant for the transfer of heat from the heat producing device. Microchannel systems have been in use for many years and are particularly useful for efficiently thermally managing devices that have one or more hot zones since the microchannels can be directed to the specific hot zones for increased thermal management thereof.

Also, conventional microchannel technology is limited to specific thermal management technologies and is not designed for usage with various other thermal management products, markets, system reliabilities and configurations. Hence, there is a need for a product that will solve the inherent limitations with microchannels as used in the thermal management industry.

BRIEF SUMMARY OF THE INVENTION

The general purpose of the present invention, which will be described subsequently in greater detail, is to provide a new microchannel thermal management system that has many of the advantages of the thermal management systems mentioned heretofore and many novel features that result in a new microchannel thermal management system which is not anticipated, rendered obvious, suggested, or even implied by any of the prior art thermal management systems, either alone or in any combination thereof.

To attain this, the present invention generally comprises a housing having an interior surface, a cap having a plurality of microchannels attached to the interior surface of the housing, and an inlet port and an outlet port extending through the housing in fluid communication with the microchannels. Alternatively, the microchannels may also extend into the interior surface of the housing. The cap is preferably thermally attached to a heat producing device by a thermal interface layer. Thermally managed coolant enters the inlet port passing through the microchannels conducting heat transferred to the cap by the heat producing device and exits through the outlet port.

There has thus been outlined, rather broadly, the more important features of the invention in order that the detailed description thereof may be better understood, and in order that the present contribution to the art may be better appreciated. There are additional features of the invention that will be described hereinafter and that will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

A primary object of the present invention is to provide a microchannel thermal management system that will overcome the shortcomings of the prior art devices.

A second object is to provide a microchannel thermal management system for thermally managing a heat producing device.

Another object is to provide a microchannel thermal management system that may be utilized in conjunction with various heat producing devices such as but not limited to devices.

Other objects and advantages of the present invention will become obvious to the reader and it is intended that these objects and advantages are within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

A. Overview

Figure 1:
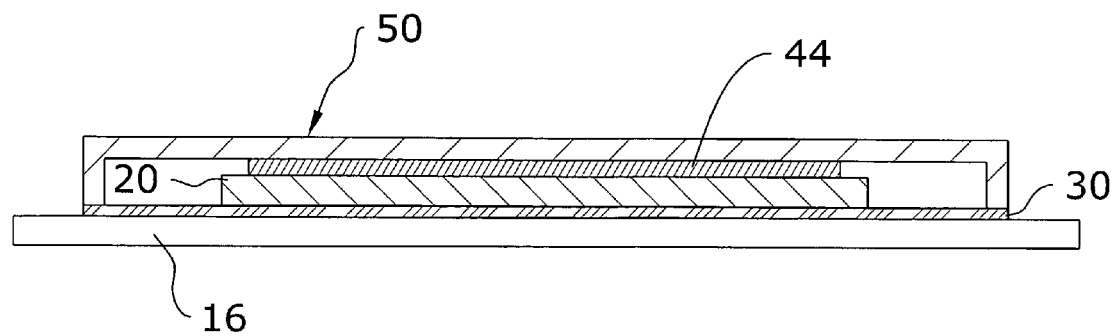
FIG. 1 is a side cutaway view of a prior art technology illustrating a device in thermal communication with a housing via a thermal interface layer.
Figure 2:
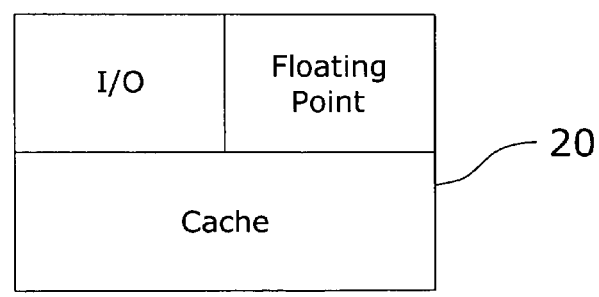
FIG. 2 is a block diagram of an illustrative device showing the various segments of a device that has different heat producing capabilities.

Turning now descriptively to the drawings, in which similar reference characters denote similar elements throughout the several views, FIGS. 3 through 11 illustrate a microchannel thermal management system 10, which comprises a housing 52 having an interior surface 53, a cap 40 having a plurality of microchannels 70 attached to the interior surface 53 of the housing 52, and an inlet port 60 and an outlet port 62 extending through the housing 52 in fluid communication with the microchannels 70. Alternatively, the microchannels 70 may also extend into the interior surface 53 of the housing 52. The cap 40 is preferably thermally attached to a heat producing device 20 (e.g. chips, integrated circuits, optoelectronic devices 20, power electronics and other electronic devices 20) by a thermal interface layer 44. Thermally managed coolant enters the inlet port 60 passing through the microchannels 70 conducting heat transferred to the cap 40 by the heat producing device 20 and exits through the outlet port 62. Although the present invention is illustrated and discussed thermally managing a single heat producing device 20, it can be appreciated that more than one heat producing device 20 may be thermally managed.

B. Housing

Figure 5:
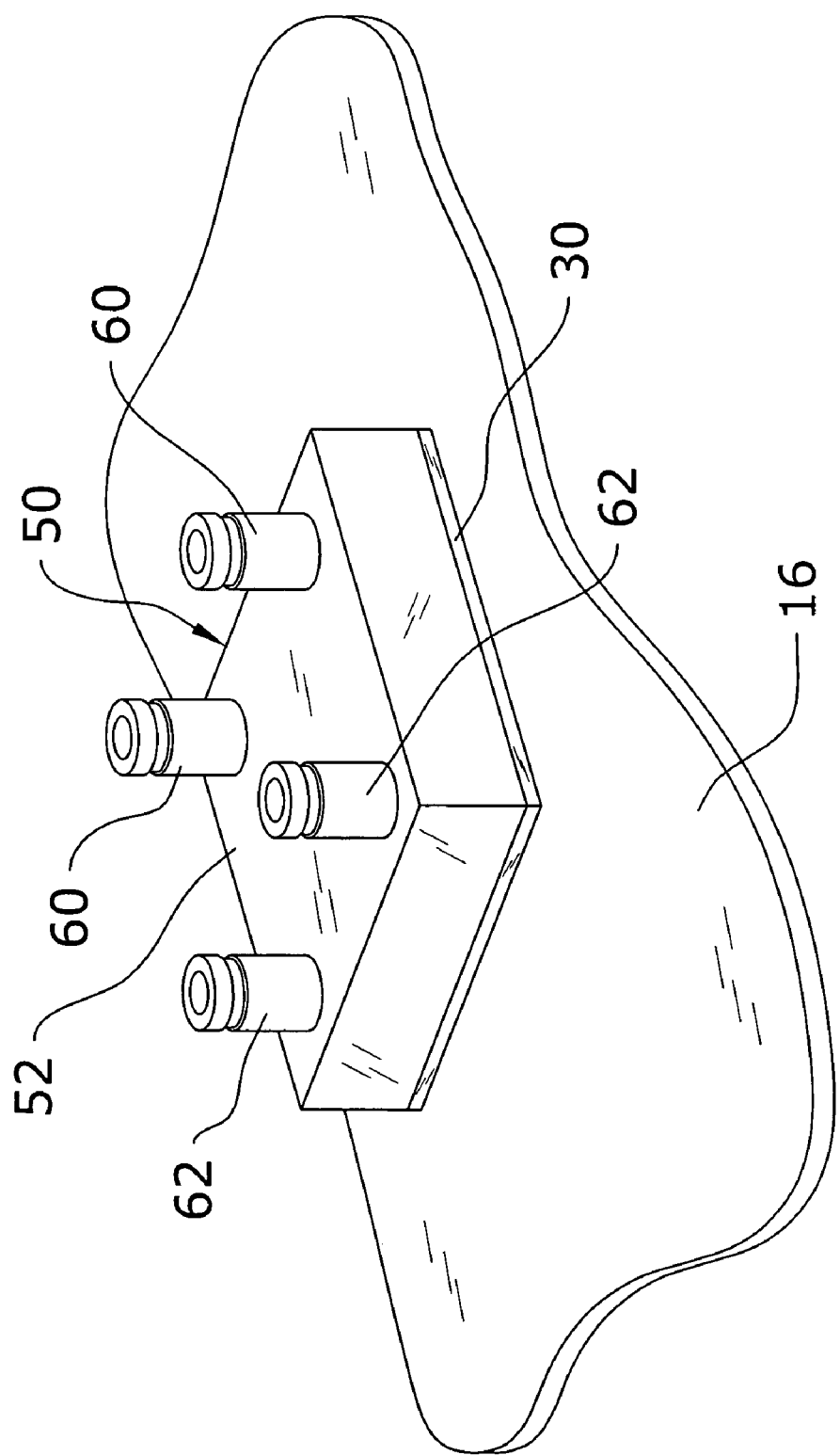
FIG. 5 is an upper perspective view of the present invention illustrating a plurality of inlet ports and outlet ports.
Figure 6:
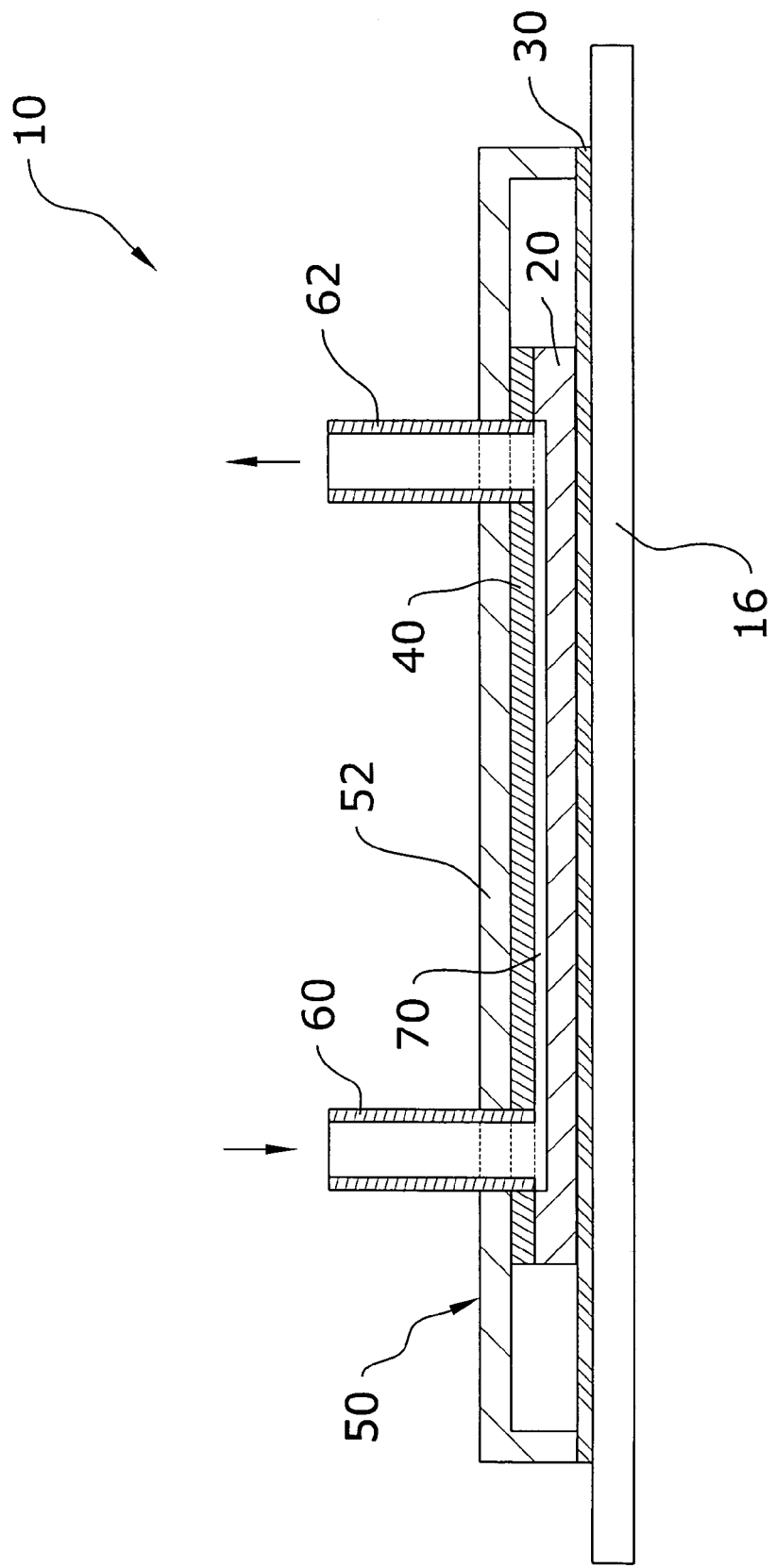
FIG. 6 is a side cutaway view of the present invention illustrating the microchannels extending into the outer surface of the device.
Figure 7:
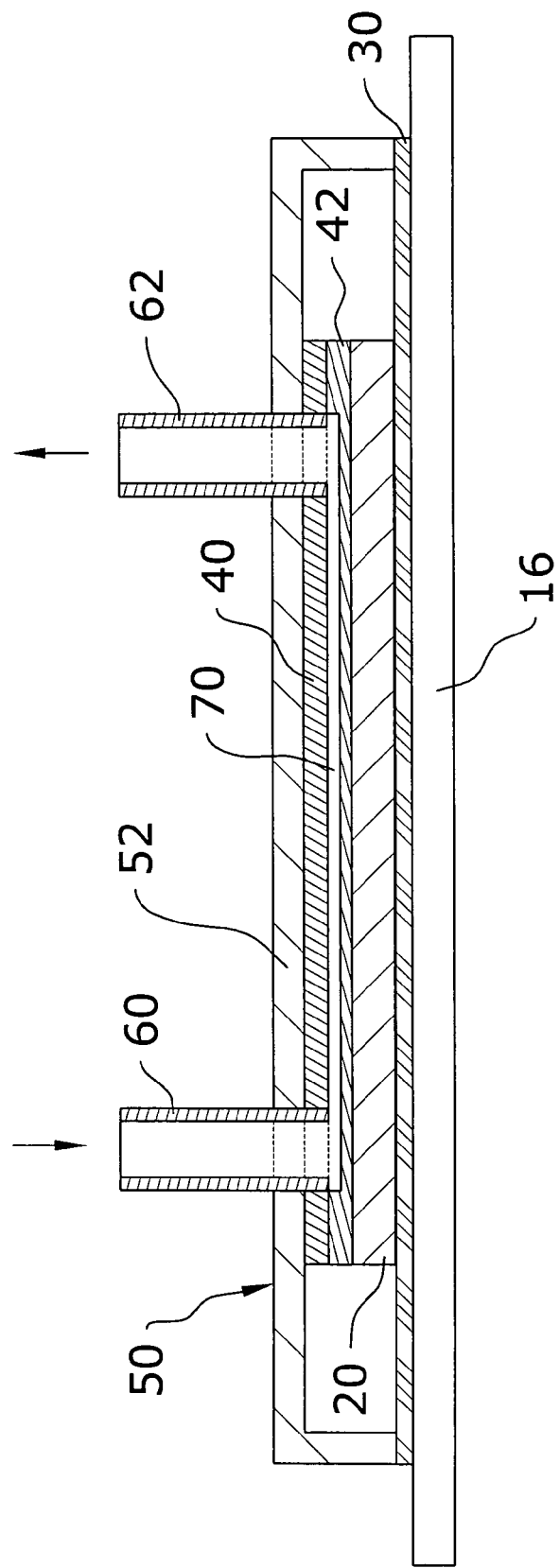
FIG. 7 is a side cutaway view of the present invention illustrating the microchannels extending into a silicon layer attached to the device.
Figure 8:
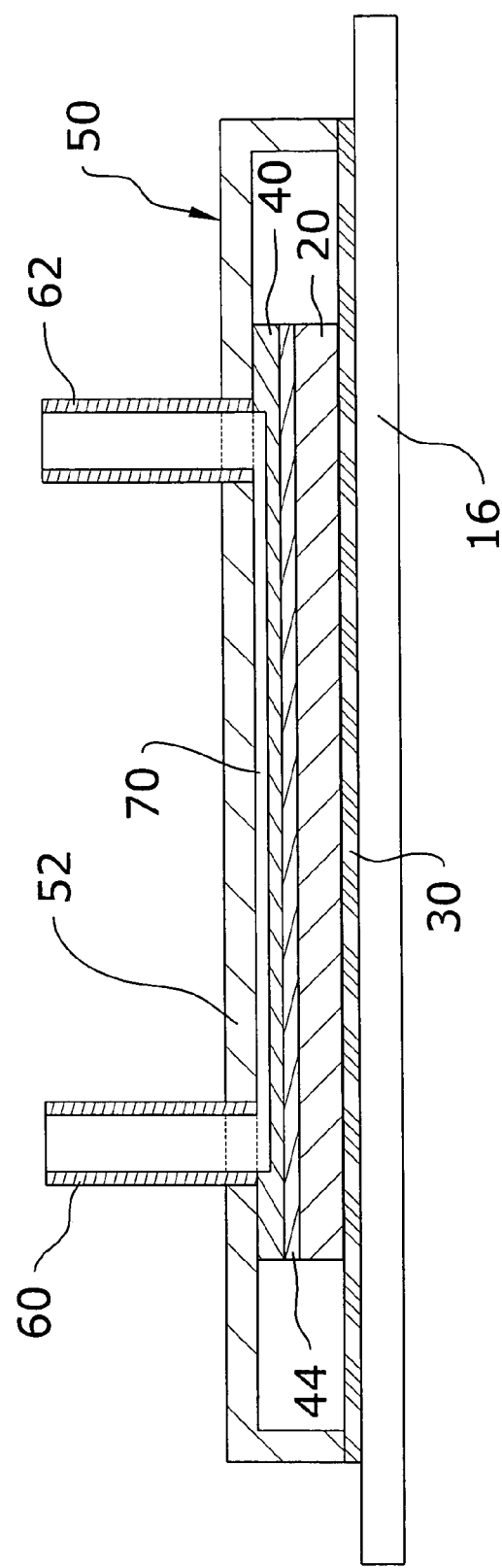
FIG. 8 is a side cutaway view of the present invention illustrating the microchannels extending into a cap that is attached in a sealed manner to the housing.

The housing 52 may be comprised of various structures, configurations and shapes other than shown in FIGS. 4 through 10 of the drawings. The housing 52 shown in FIGS. 4 through 10 illustrates an exemplary housing 52 for a chip that is attached to a substrate 30 or similar structure about the chip. The substrate 30 is in electrical communication with the chip and a circuit board 16 as shown in FIGS. 6 through 8 of the drawings. The housing 52 preferably seals at least one chip (or other heat producing device 20) upon the substrate 30 and protects the chip from damage. The housing 52 may completely or partially enclose the heat producing device 20.

The housing 52 has an interior surface 53 as shown in FIGS. 6 through 10 of the drawings. The interior surface 53 of the housing 52 may receive the microchannels 70 or seal the microchannels 70 within a cap 40 as will be discussed in additional detail below. It may be preferable to have housing 52 be constructed from a material having a coefficient of thermal expansion near that of the substrate 30.

C. Cap

Figure 9:
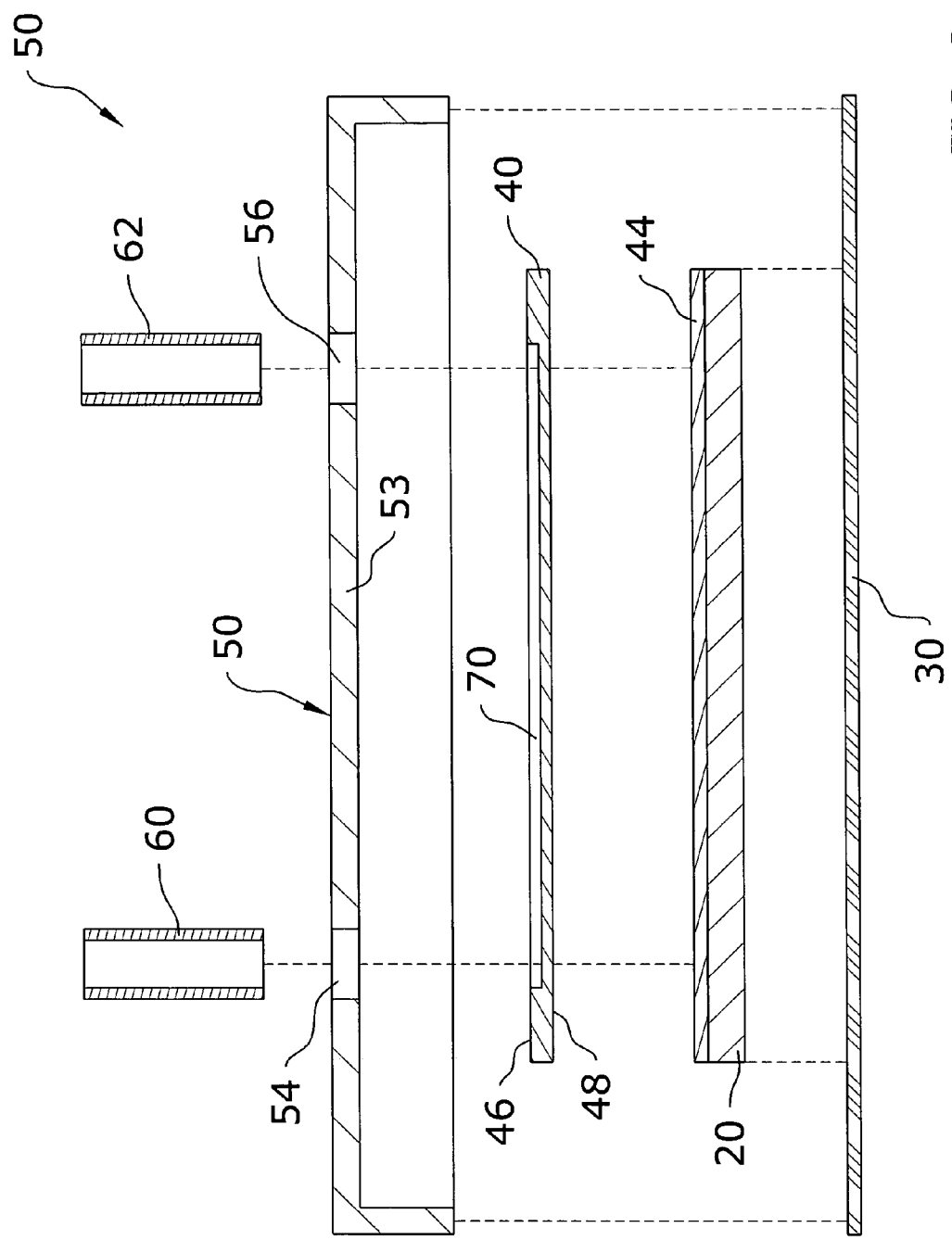
FIG. 9 is an exploded side cutaway view of FIG. 8.
Figure 10:
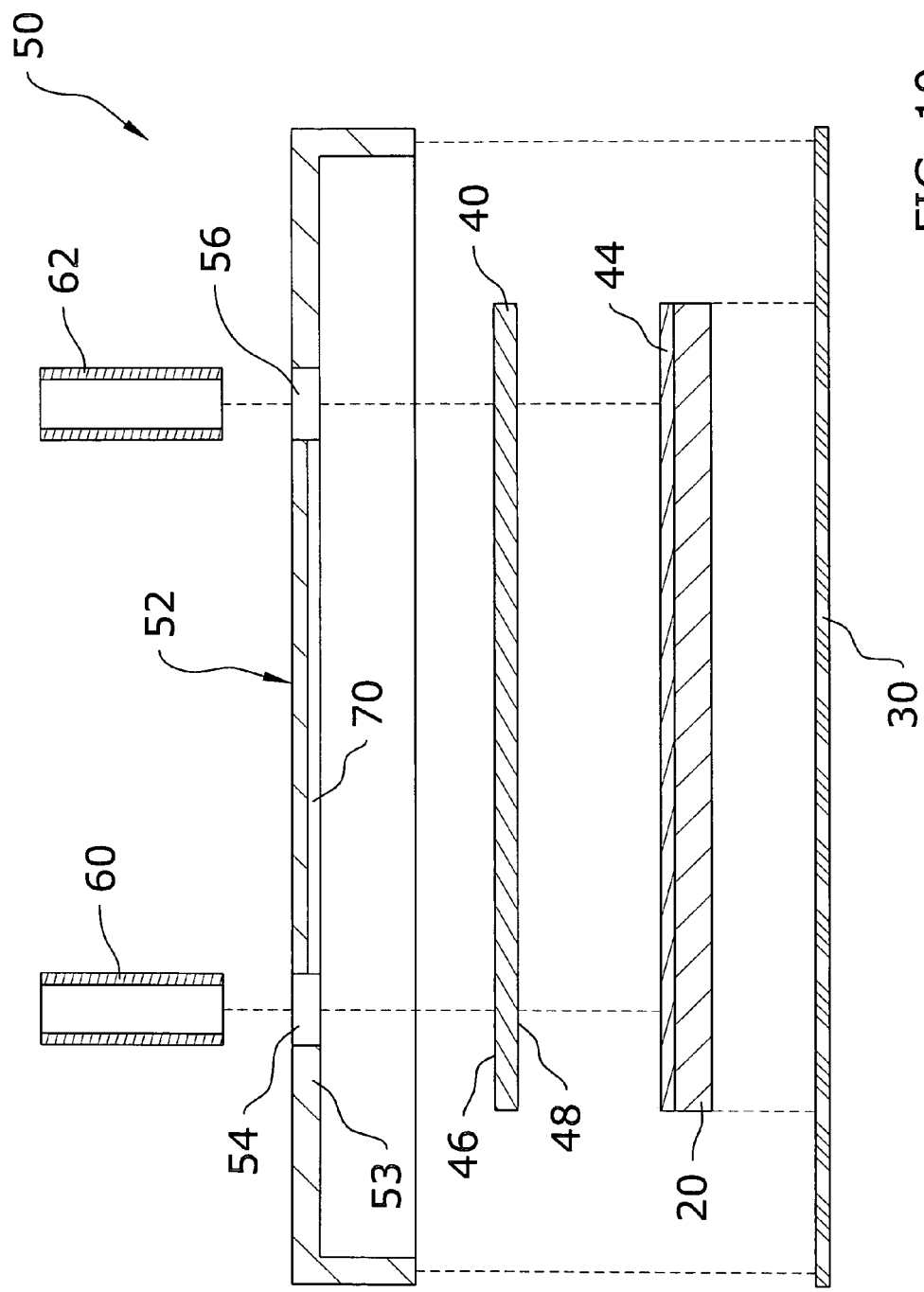
FIG. 10 is an exploded side cutaway view of the present invention illustrating the microchannels extending into the interior surface of the housing.

The cap 40 has a first surface 46 and a second surface 48 in opposition to one another. The cap 40 is preferably comprised of a relatively flat and planar structure as shown in FIGS. 9 and 10 of the drawings. The first surface 46 of the cap 40 is preferably attached to the interior surface 53 of the housing 52 as shown in FIGS. 6 through 8 of the drawings. The first surface 46 of the cap 40 may be attached to the interior surface 53 of the housing 52 utilizing various adhesives and sealants. The first surface 46 of the cap 40 is preferably flat and planar.

The second surface 48 of the cap 40 is preferably in thermal communication with the heat producing device 20 as shown in FIG. 8 of the drawings. A thermal interface layer 44 is preferably attached between the second surface 48 of the cap 40 and the heat producing device 20 as shown in FIGS. 8 through 10 of the drawings.

D. Microchannels

Figure 11:
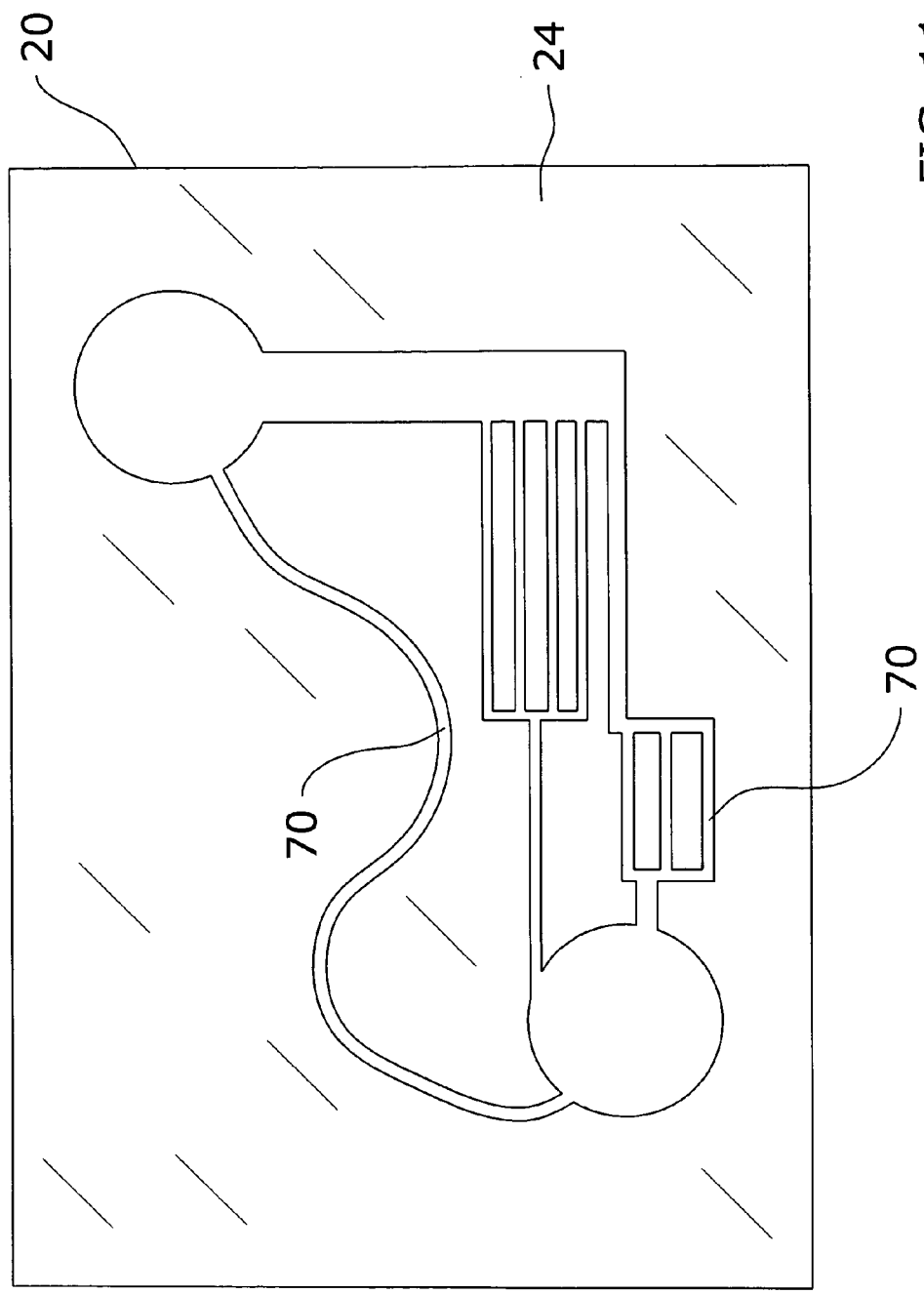
FIG. 11 is a top view of an outer surface of a device with an illustration of a plurality of microchannels extending into the outer surface thereof.

A plurality of microchannels 70 preferably extend into either (or both) the interior surface 53 of the housing 52 (FIG. 10) or the first surface 46 of the cap 40 (FIGS. 8 and 9). Microchannels currently utilized in the thermal management industry typically range between 20 to 500 micrometers in size, though greater or less sizes may be utilized. The microchannels 70 may have various lengths, shapes, patterns and configurations as illustrated in FIG. 11 of the drawings. As shown in FIG. 11 of the drawings, the plurality of microchannels 70 preferably connect to form a single channel or connect at the inlet port 60 or outlet port 62 locations.

It is preferable to optimize microchannels 70 adjacent to one or more "hot zones" (e.g. floating point on a chip) upon the heat producing device 20. The microchannels 70 adjacent to hot zones on the heat producing device 20 may be increased in number and/or closer together and varied in width, length and/or height, thereby increasing the heat removal rates over the hot zones of heat producing device 20. Optimal heat transfer rates of microchannels are described by U.S. Pat. No. 4,450,472 and U.S. Patent Application Publication No. 2003/0164231 which are hereby incorporated by reference.

E. Inlet and Outlet Ports

At least one inlet port 60 and at least one outlet port 62 preferably extend through the housing 52 in fluid communication with the microchannels 70 as shown in FIGS. 4 through 10 of the drawings. FIG. 5 illustrates the usage of a plurality of inlet ports 60 and a plurality of outlet ports 62.

The inlet port 60 preferably extends through an inlet opening 54 within the housing 52 as shown in FIGS. 9 and 10 of the drawings. The outlet port 62 preferably extends through an outlet opening 56 within the housing 52 as shown in FIGS. 9 and 10 of the drawings. An inlet coupler is preferably attached to the inlet port 60 and an outlet coupler is preferably attached to the outlet port 62 for removably coupling to a coolant management system 18. The inlet opening 54 and the outlet opening 56 may be constructed of a self sealing and/or quick-coupler structure such as disclosed in U.S. patent application Ser. No. 10/769,561 filed Jan. 30, 2004 which is hereby incorporated by reference. A self-sealing structure for the inlet opening 54 and the outlet opening 56 allows the microchannels 70 to be precharged with fluid and/or prepressurized to a desired pressure, prior to being connected to a thermal management unit 50.

Rigid inlet opening 54 and outlet opening 56 are secured to housing 52 and provide the ability to connect inlet port 60 and outlet port 62 in a fashion that creates a rugged assembly. Working forces upon openings 54 and 56 are translated into the housing 52 and away from device 20. Rigid inlet opening 54 and outlet opening 56 also allow for the automated connection of ports 60 and 62 as needed for high volume testing and burn-in of the heat producing device 20.

F. Coolant Management System

Figure 3:
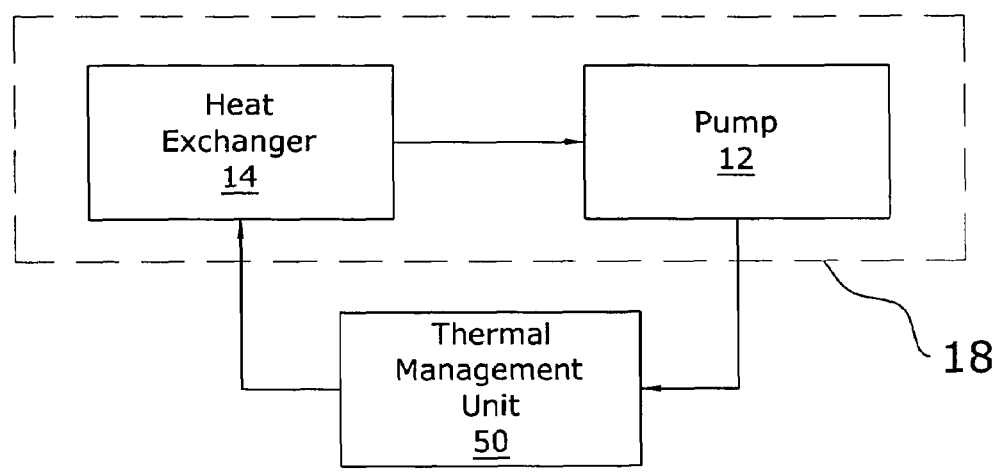
FIG. 3 is a block diagram of the present invention.
Figure 4:
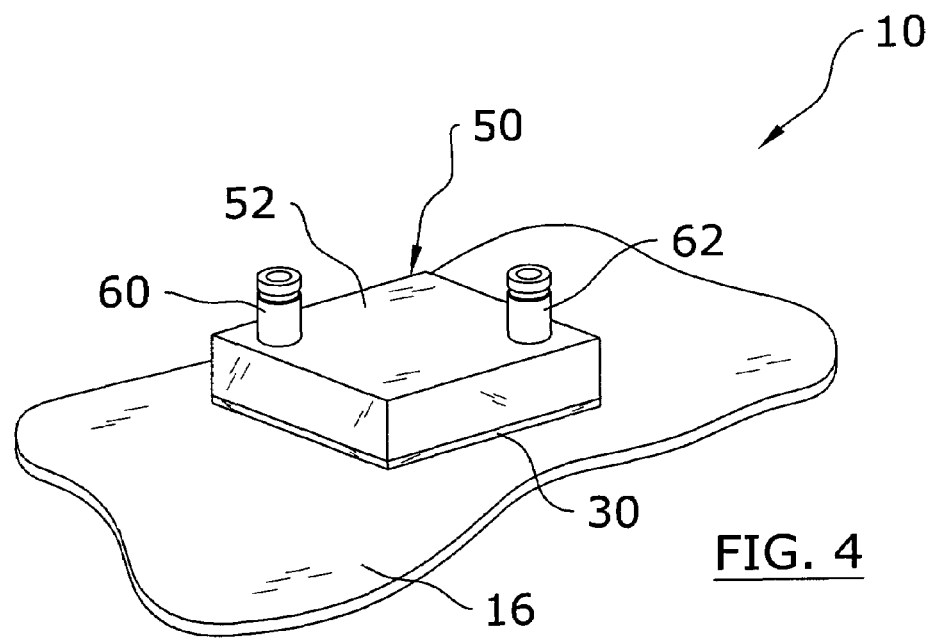
FIG. 4 is an upper perspective view of the present invention.

The coolant management system 18 may be comprised of various conventional well-known technologies. An exemplary configuration is illustrated in FIG. 3 illustrating a heat exchanger 14 fluidly connected between the thermal management unit 50 and the pump 12. The heat exchanger 14 thermally conditions the coolant received from the outlet port 62 of the thermal management unit 50.

A pump 12 is also preferably fluidly connected between the heat exchanger 14 and the thermal management unit 50 as shown in FIG. 3 of the drawings. The pump 12 provides the thermally conditioned coolant to the thermal management unit 50 via the inlet port 60. Various other configurations and structures may be utilized for the coolant management system 18 other than shown in the drawings.

As stated previously, the coolant management system 18 may be comprised of various configurations and structures capable of thermally managing liquid coolant. In addition, the coolant management system 18 preferably utilizes quick couplers for sealably connecting to the inlet port 60 and the outlet port 62 of the thermal management unit 50. Various coupler units may be utilized upon the coolant management system 18 and the inlet ports 60 and the outlet ports 62 of the thermal management unit 50.

It can be appreciated that a control system may be utilized to control the overall operation of the present invention. The control system may be in communication with the heat producing device 20, the circuit board 16, the pump 12, the heat exchanger 14 and the coolant management system 18. The control system may include various sensors such as but not limited to pressure sensors, coolant temperature sensors and flow rate sensors and the like. The sensors may be positioned within the inlet port 60, the outlet port 62, the cap 40, the first layer 42 and/or the housing 52.

E. Configurations of Invention

FIGS. 6 and 11 illustrate a first configuration of the present invention wherein the microchannels 70 are formed into the outer surface 24 of the heat producing device 20. The first configuration is desirable for thermal management of the heat producing device 20 since the coolant is in direct thermal contact with the heat producing device 20. The cap 40 is preferably attached to the outer surface 24 of the heat producing device 20 to seal the microchannels 70 as shown in FIG. 6. The inlet port 60 and the outlet port 62 extend through corresponding openings within the cap 40 as further shown in FIG. 6 of the drawings. The cap 40 is also preferably attached to the interior surface 53 of the housing 52. However, this configuration can be difficult to implement since the microchannels 70 are formed directly within the heat producing device 20 and complicate fabrication and testing. This configuration also renders the heat producing device 20 to be only liquid cooled, rather than liquid and/or air cooled.

FIG. 7 illustrates a second configuration of the present invention wherein a first layer 42 (e.g. silicon) is attached to the outer surface 24 of the heat producing device 20. Attachment of the first layer 42 to outer surface 24 may be accomplished through the use of solders, epoxies and other attachment systems. The microchannels 70 are formed directly into the surface of the first layer 42 opposite of the heat producing device 20 and are sealed by the cap 40 as further shown in FIG. 7 of the drawings.

FIGS. 8 and 9 illustrate a third configuration of the present invention wherein the microchannels 70 are formed into the first surface 46 of the cap 40. The cap 40 is then directly attached to the interior surface 53 of the housing 52 with the microchannels 70 in fluid communication with the inlet port 60 and the outlet port 62. The microchannels 70 are sealed between the cap 40 and the housing 52 to prevent leakage of coolant from the microchannels 70. The cap 40 is preferably in thermal communication with the heat producing device 20 by a thermal interface layer 44 attached between the cap 40 and the heat producing device 20 as shown in FIGS. 8 and 9. It can be appreciated that the cap 40 may be directly attached to the heat producing device 20 without a thermal interface layer 44, however heat conduction will likely decrease.

FIG. 10 illustrates an exploded side cutaway view of a fourth configuration of the present invention wherein the microchannels 70 are formed into the interior surface 53 of the housing 52. The cap 40 is attached to the interior surface 53 of the housing 52 thereby sealing the microchannels 70 between thereof.

It should be appreciated that other embodiments are possible within the spirit and scope of the invention. For example, it is possible to have etched microchannels 70 within the cap 40 and fluid manifolds formed into housing 52. The resulting structure allows fluid to flow with little resistance from inlet port 60 to the one or more microchannels 70.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims (and their equivalents) in which all terms are meant in their broadest reasonable sense unless otherwise indicated. Any headings utilized within the description are for convenience only and have no legal or limiting effect.

I claim:

1. A thermal management system, comprising:
    a substrate;
    a housing having an interior surface;
    wherein said housing is comprised of a unitary structure;
    a cap having a first surface and a second surface;
    wherein said first surface and said interior surface are substantially planar;
    wherein said first surface of said cap is attached to said interior surface of said housing;
    wherein said second surface of said cap is in thermal communication with at least one heat producing device;
    a thermal interface layer between said cap and said heat producing device;
    wherein said housing is attached to said substrate and wherein said housing surrounds said at least one heat producing device; and
    a plurality of microchannels within said interior surface of said housing, wherein said plurality of microchannels are between 20 micrometers to 500 micrometers;
    wherein said plurality of microchannels are formed into said interior surface of said housing so as to cover a greater surface area adjacent to at least one hot zone upon said at least one heat producing device.

2. The thermal management system of claim 1, including at least one inlet port and at least one outlet port extending through said housing in fluid communication with said microchannels.

3. The thermal management system of claim 2, wherein said at least one inlet port is comprised of a plurality of inlet ports.

4. The thermal management system of claim 2, wherein said at least one outlet port is comprised of a plurality of outlet ports.

5. The thermal management system of claim 4, wherein said wherein said at least one inlet port is comprised of a plurality of inlet ports.

6. The thermal management system of claim 2, wherein said at least one inlet port and said at least one outlet port extend through an inlet opening and an outlet opening within said housing respectively.

7. The thermal management system of claim 1, including an inlet coupler attached to said inlet port and an outlet coupler attached to said outlet port for removably coupling to a coolant management system.

8. The thermal management system of claim 1, wherein at least one of said plurality of microchannels is formed into said first surface of said cap.

9. A thermal management system, comprising:
a substrate;
a housing having an interior surface;
wherein said housing is comprised of a unitary structure;
a cap having a first surface and a second surface;
wherein said first surface and said interior surface are substantially planar;
wherein said first surface of said cap is attached to said interior surface of said housing;
wherein said second surface of said cap is in thermal communication with at least one heat producing device;
a thermal interface layer between said cap and said heat producing device;
wherein said housing is attached to said substrate and wherein said housing surrounds said at least one heat producing device;
a plurality of microchannels within said interior surface of said housing, wherein said plurality of microchannels are between 20 micrometers to 500 micrometers;
wherein said plurality of microchannels are formed into said interior surface of said housing so as to cover a greater surface area adjacent to at least one hot zone upon said at least one heat producing device;
at least one inlet port and at least one outlet port extending through said housing in fluid communication with said microchannels;
wherein said at least one inlet port is comprised of a plurality of inlet ports;
wherein said at least one outlet port is comprised of a plurality of outlet ports;
wherein said at least one inlet port and said at least one outlet port extend through an inlet opening and an outlet opening within said housing respectively; and
an inlet coupler attached to said inlet port and an outlet coupler attached to said outlet port for removably coupling to a coolant management system.

10. The thermal management system of claim 9, wherein at least one of said plurality of microchannels is formed into said first surface of said cap.

* * * * *